US011393617B2

(12) United States Patent
Dong et al.

(10) Patent No.: US 11,393,617 B2
(45) Date of Patent: Jul. 19, 2022

(54) FLEXIBLE DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaonan Dong, Beijing (CN); Zhonghao Huang, Beijing (CN); Yongliang Zhao, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,391

(22) PCT Filed: May 24, 2019

(86) PCT No.: PCT/CN2019/088271
§ 371 (c)(1),
(2) Date: Feb. 24, 2020

(87) PCT Pub. No.: WO2019/228256
PCT Pub. Date: Dec. 5, 2019

(65) Prior Publication Data

US 2021/0366638 A1 Nov. 25, 2021

(30) Foreign Application Priority Data

Jun. 1, 2018 (CN) ......................... 201810558549.0

(51) Int. Cl.
*H05K 5/00* (2006.01)
*H01F 7/06* (2006.01)

(52) U.S. Cl.
CPC ........... *H01F 7/066* (2013.01); *H05K 5/0017* (2013.01)

(58) Field of Classification Search
CPC .............................. H01F 7/066; H05K 5/0017
See application file for complete search history.

(56) References Cited

U.S. PATENT DOCUMENTS 9,829,922 B2 * 11/2017 Hong .................... G06F 1/1652
2008/0086925 A1 4/2008 Yang
(Continued)

FOREIGN PATENT DOCUMENTS

CN 101163163 B 4/2008
CN 201185067 Y 1/2009
(Continued)

OTHER PUBLICATIONS

Chinese Office Action corresponding to CN 201810558549.0; dated Jun. 4, 2019 (14 pages, including English translation).

*Primary Examiner* — Rockshana D Chowdhury
(74) *Attorney, Agent, or Firm* — Myers Bigel, P.A.

(57) ABSTRACT

A flexible display device includes a flexible display panel, a reel, a substantially U-shaped guide rail, and a magnetic field generating member. The reel is provided with a slit opening in a surface thereof and a rotating shaft inside. The U-shaped guide rail has an open side and a closed end, and the closed end is arranged adjacent to the rotating shaft. The rectilinear conductor is configured to bridge the open side of the U-shaped guide rail to form a closed circuit with the U-shaped guide rail. The magnetic field generating member is configured to provide a magnetic field to the rectilinear conductor. A first side edge of the flexible display panel is connected with the rotating shaft of the reel through the slit (Continued)

opening, and a second side edge of the flexible display panel opposite to the first side edge is connected with the rectilinear conductor.

15 Claims, 3 Drawing Sheets

(56) References Cited

U.S. PATENT DOCUMENTS

| | | | | |
|---|---|---|---|---|
| 2008/0223746 | A1 * | 9/2008 | Van Rens .......... | B65D 81/2069 257/40 |
| 2014/0002430 | A1 * | 1/2014 | Kwack .................. | G09G 3/035 345/207 |
| 2015/0340004 | A1 | 11/2015 | Pang | |
| 2016/0163242 | A1 | 6/2016 | Lee et al. | |
| 2016/0187929 | A1 | 6/2016 | Kim et al. | |
| 2016/0324021 | A1 | 11/2016 | Takayanagi et al. | |
| 2016/0374228 | A1 | 12/2016 | Park et al. | |
| 2016/0381814 | A1 | 12/2016 | Wang et al. | |
| 2017/0364122 | A1 | 12/2017 | Kim et al. | |

FOREIGN PATENT DOCUMENTS

| | | | | |
|---|---|---|---|---|
| CN | 201191468 | Y | | 2/2009 |
| CN | 101635119 | A | | 1/2010 |
| CN | 102956161 | A | * | 3/2013 |
| CN | 102956161 | A | | 3/2013 |
| CN | 202806099 | U | * | 3/2013 |
| CN | 202806099 | U | | 3/2013 |
| CN | 104680943 | A | * | 6/2015 |
| CN | 104680943 | A | | 6/2015 |
| CN | 104882078 | A | | 9/2015 |
| CN | 105741683 | A | | 7/2016 |
| CN | 106257569 | A | | 12/2016 |
| CN | 206020521 | U | | 3/2017 |
| CN | 206541552 | U | | 10/2017 |
| CN | 108735105 | A | | 11/2018 |

* cited by examiner

FLEXIBLE DISPLAY DEVICE

CROSS REFERENCE TO RELATED APPLICATIONS

This application is a 35 U.S.C. 371 national stage application of a PCT International Application No. PCT/CN2019/088271, filed on May 24, 2019, which claims priority from Chinese patent application No. 201810558549.0 filed on Jun. 1, 2018, the entire contents of which are hereby incorporated by reference in their entireties.

TECHNICAL FIELD

The present disclosure relates to the technical field of display, in particular to a flexible display device.

BACKGROUND

With the development of display technology, flexible displays are more and more popular for their compliance, portability, flexibility and impact resistance.

Due to its flexibility, flexible displays can bend under force when displaying or not displaying, and maintain good display performance. However, the current flexible display panels in the flexible displays in the related art are difficult to realize autonomous rolling and unrolling. Moreover, the rolled flexible display panels always tend to roll again when being unrolled for display, thus causing the flexible display panels to display in a non-flat state, and cannot stably maintain flatness within a given display time after unrolling, resulting in poor display effect.

SUMMARY

In view of this, some exemplary embodiments of the present disclosure provide a flexible display device including a flexible display panel, a reel, a substantially U-shaped guide rail, and a magnetic field generating member. The reel is provided with a slit opening at a surface thereof and a rotating shaft arranged inside. The U-shaped guide rail has an open side and a closed end opposite to each other, and the closed end is arranged adjacent to the rotating shaft. A rectilinear conductor is configured to bridge the open side of the U-shaped guide rail to form a closed circuit with the U-shaped guide rail. The magnetic field generating member is configured to provide a magnetic field to the rectilinear conductor. A first side edge of the flexible display panel is connected with the rotating shaft of the reel through the slit opening, and a second side edge of the flexible display panel opposite to the first side edge is connected with the rectilinear conductor.

According to an aspect of the present disclosure, the flexible display device is configured such that when the rectilinear conductor is energized, the rectilinear conductor can be forced, thereby causing the flexible display panel to be in any of the following states: unrolling in a direction away from the reel; rolling toward the direction of the reel; and a tensioned and stationary state.

According to an aspect of the present disclosure, the flexible display panel is configured such that the second side edge thereof surrounds the rectilinear conductor and is connected to the rectilinear conductor.

According to an aspect of the present disclosure, the magnetic field generating member includes a conductive coil disposed at a periphery of the rectilinear conductor, and the flexible display device is configured so that when the conductive coil is energized, the rectilinear conductor can be forced, thereby causing the flexible display panel to be in any of the following states: unrolling in a direction away from the reel; rolling toward the direction of the reel; and a tensioned and stationary state.

According to an aspect of the present disclosure, the conductive coil is disposed at a side of a periphery of the rectilinear conductor away from the rectilinear conductor.

According to an aspect of the present disclosure, the conductive coil is disposed at a side of the periphery of the rectilinear conductor adjacent to the rectilinear conductor. The flexible display device further comprises a flexible substrate arranged below the rectilinear conductor, wherein a first side edge of the flexible substrate is fixed with the rotating shaft, and a second side edge of the flexible substrate opposite to the first side edge surrounds the rectilinear conductor and is fixed with the rectilinear conductor.

According to an aspect of the present disclosure, the magnetic field generating member includes a conductive coil disposed at a periphery of the rectilinear conductor, and the flexible display device is configured so that when the conductive coil is energized, the rectilinear conductor can be forced, thereby causing the flexible display panel to be in any of the following states: unrolling in a direction away from a reel; rolling toward the direction of the reel; and a tensioned and stationary state.

According to an aspect of the present disclosure, the flexible display device further includes a driving member connected to the rotating shaft for driving the rotating shaft to move.

According to an aspect of the present disclosure, the driving member is an electric motor.

According to an aspect of the present disclosure, the flexible display device further includes a power supply unit configured to supply power to at least one of the magnetic field generating member, the U-shaped guide rail and the electric motor.

According to an aspect of the present disclosure, the U-shaped guide rail is a flexible U-shaped guide rail, the closed end of which can be fixed to the rotating shaft, and the flexible U-shaped guide rail can be rolled into the reel together with the flexible display panel in use. The U-shaped guide rail is made of metal, for example.

According to an aspect of the present disclosure, the reel is a light shielding reel.

According to an aspect of the present disclosure, the length direction of the slit opening is parallel to the axial direction of the rotating shaft, and the opening direction thereof is aligned with the flexible display panel.

DETAILED DESCRIPTION

In order to make the purpose, technical solution and advantages of the embodiments of the present disclosure clearer, the following will clearly and completely describe the technical solution of the embodiments of the present disclosure with reference to the drawings of the embodiments of the present disclosure. Obviously, the described embodiments are some embodiments of the present disclosure, not all embodiments. Based on the described embodiments of the present disclosure, all other embodiments obtained by those of ordinary skills in the art without creative efforts are within the scope of protection of the present disclosure.

Unless otherwise defined, technical terms or scientific terms used in this disclosure shall have the ordinary meaning understood by those with ordinary skills in the field to which this disclosure belongs. The words “first”, “second” and the like used in this disclosure do not indicate any order, quantity or importance, but are only used to distinguish different components. Similar words such as “comprising” or “including” mean that the element or article appearing before the word encompasses the elements or articles listed after the word and their equivalents, and do not exclude other elements or articles. Similar words such as “connected” or “coupled” are not limited to physical or mechanical connections, but may include electrical connections, whether direct or indirect. “Up”, “down”, “left” and “right” are only used to indicate the relative positional relationship. When the absolute position of the described object changes, the relative positional relationship may also change accordingly.

In order to keep the following description of embodiments of the present disclosure clear and concise, detailed descriptions of certain known functions and known components are omitted from the present disclosure.

In order to alleviate the problem that the flexible display panel in the related art is difficult to realize autonomous rolling and unrolling, and to alleviate the problem that the flexible display panel cannot maintain stable and flat displaying for a long time and has poor display effect when the flexible display panel is rolled and then unrolled for display, some exemplary embodiments of the present disclosure provide a flexible display device.

Figure 1:
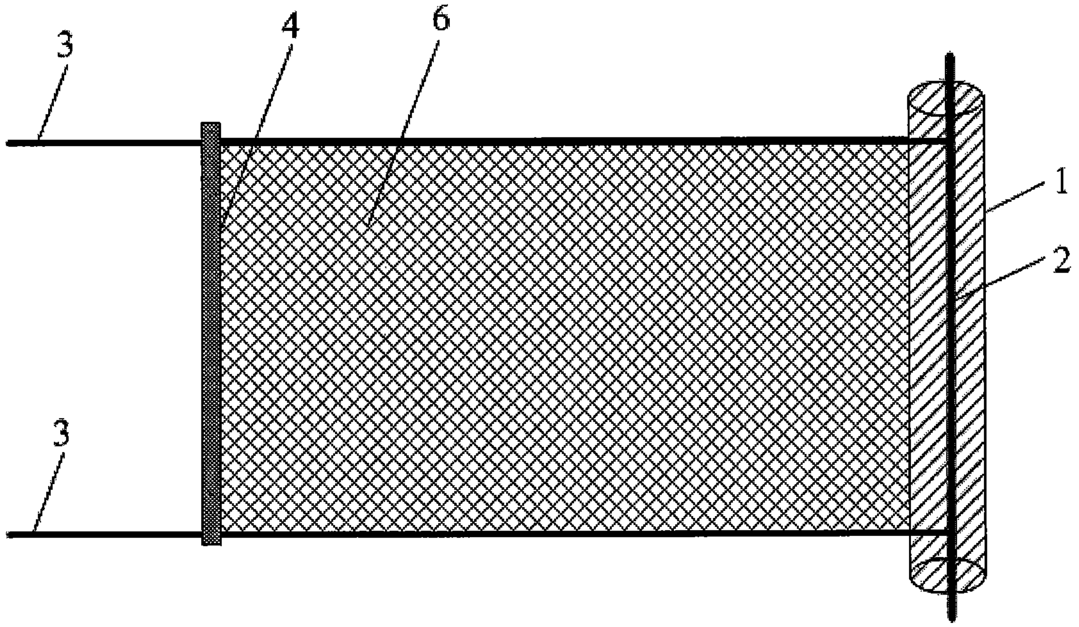
FIG. 1 is a schematic top view of a flexible display device according to some exemplary embodiments of the disclosure.
Figure 2:
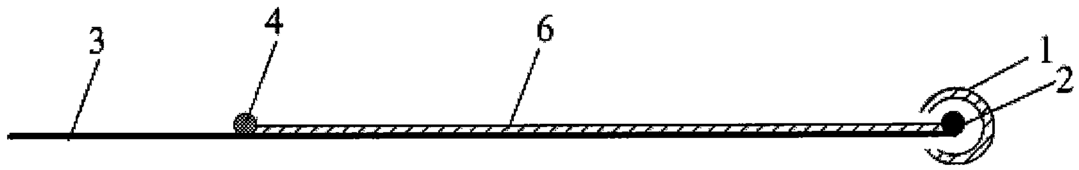
FIG. 2 is a schematic side view of a flexible display device according to some exemplary embodiments of the present disclosure.

Referring to FIGS. 1 and 2, some exemplary embodiments of the present disclosure provide a flexible display device including a flexible display panel 6 and a reel 1 with a rotating shaft 2, wherein the surface of the reel 1 is provided with a slit opening (not shown in FIG. 1) parallel to the axial direction of the rotating shaft 2, and a first side edge of the flexible display panel 6 is connected with the rotating shaft 2 of the reel 1 through the slit opening. The flexible display device further comprises a U-shaped guide rail 3, a rectilinear conductor 4 bridging an open side of the opening of the U-shaped guide rail 3, and a magnetic field generating member (not shown in FIGS. 1-2) for applying a magnetic field to the rectilinear conductor 4, wherein a closed end of the U-shaped guide rail 3 is fixed with the rotating shaft 2, the rectilinear conductor 4 is also connected with a second side edge of the flexible display panel 6 opposite to the first side edge, and the rectilinear conductor 4 and the U-shaped guide rail 3 form a closed circuit.

The flexible display device provided by some exemplary embodiments of the present disclosure includes the magnetic field generating member and the closed circuit composed of the rectilinear conductor and the U-shaped guide rail. The second side edge of the flexible display panel is connected with the rectilinear conductor, and the opposite first side thereof is connected with the rotating shaft. Since the energized rectilinear conductor receives an ampere force under the action of the magnetic field, the rectilinear conductor moves along the U-shaped guide rail under the action of the ampere force. Furthermore, the flexible display panel can be driven to move. Therefore, when the flexible display panel needs to display, the flexible display panel can be automatically unrolled from the reel to display; and when it does not need to display, the flexible display panel can be automatically rolled into the reel by driving the rotating shaft of the reel, so that the flexible display panel can realize the functions of autonomous unrolling and rolling. Comparatively, as to the flexible display panel of the related art, when the rolled flexible display panel is unrolled to display, it always tends to be rolled again, thereby causing a non-flat state when the flexible display panel is displaying, resulting in the problem of poor display effect when the flexible display panel is stably displaying. According to the flexible display device of some exemplary embodiments of the present disclosure, when the flexible display panel needs to stably display, due to the provision of the magnetic field generating member, the closed circuit formed by the rectilinear conductor and the U-shaped guide rail, and the rotating shaft, the stress on the flexible display panel is balanced by adjusting the magnetic induction intensity of the magnetic field generating member or the magnitude of the current flowing through the rectilinear conductor and the magnitude of the voltage or current driving the rotating shaft so that the flexible display panel can stably display, thereby avoiding the problem that the flexible display panel has poor display effect when stably displaying due to the non-flat state during stable displaying.

In specific implementation, the magnetic field generating member may be, for example, an energized conductive coil, or magnetic poles of the same polarity (e.g., both N poles or both S poles) disposed below the flexible display panel and the guide rail. The following takes the magnetic field generating member being the conductive coil as an example, and illustrates the set position of the magnetic field generating member in some exemplary embodiments of the present disclosure by specific examples.

Figure 3:
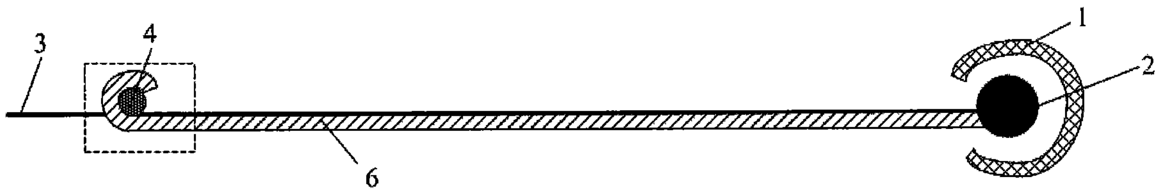
FIG. 3 is a schematic side view of a flexible display device according to other exemplary embodiments of the present disclosure.
Figure 4:
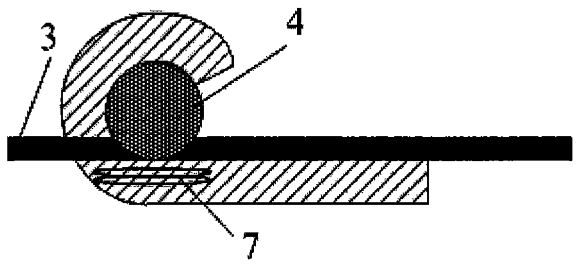
FIG. 4 is a schematic side view of a first flexible display device provided with a conductive coil according to some exemplary embodiments of the present disclosure.
Figure 5:
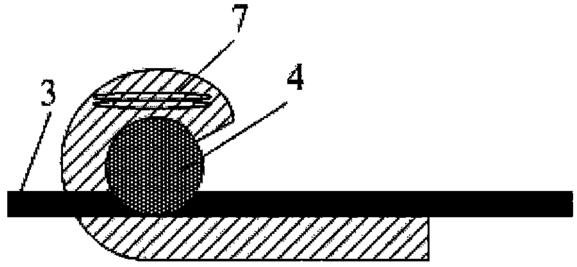
FIG. 5 is a schematic side view of a second flexible display device provided with a conductive coil according to some exemplary embodiments of the present disclosure.
Figure 6:
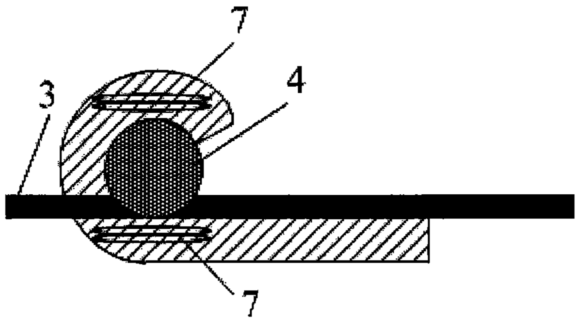
FIG. 6 is a schematic side view of a third flexible display device provided with conductive coils according to some exemplary embodiments of the present disclosure.

For example, referring to FIGS. 3 and 4, wherein FIG. 4 is an enlarged structural schematic view of a dashed box in FIG. 3, the second side edge of the flexible display panel 6 opposite to the first side edge surrounds the rectilinear conductor 4 and is connected to the rectilinear conductor 4. The flexible display panel 6 is provided with a conductive coil 7 at a position around the rectilinear conductor 4. According to the magnetic effect of the current, a magnetic field will be generated when the conductive coil 7 is energized, and the rectilinear conductor 4 will move on the U-shaped guide rail 3 under the action of the magnetic field provided by the conductive coil 7. The flexible display panel 6 may specifically be provided with a conductive coil at a position around the rectilinear conductor 4 and below the rectilinear conductor 4, as shown in FIG. 4. It is also possible to arrange the conductive coil 7 at a position around the rectilinear conductor 4 and above the rectilinear conductor 4, as shown in FIG. 5. Alternatively, conductive coils 7 can be provided at positions around the rectilinear conductor 4, both above the rectilinear conductor 4 and below the rectilinear conductor 4, as shown in FIG. 6. So the rectilinear conductor 4 moves on the U-shaped guide rail 3 under the action of the magnetic field generated by the conductive coil 7, thereby driving the flexible display panel 6 to be unrolled from the reel 1. Of course, when the conductive coils 7 are disposed both at the upper and lower sides of the rectilinear conductor 4, it is necessary to ensure that the winding directions of the two conductive coils 7 are consistent to generate magnetic fields in the same direction. In specific implementation, the current direction of the rectilinear conductor 4 and the current direction of the energized coil 7 can be adjusted so that the magnetic field generated by the energized coil 7 generates an ampere force to the left (i.e., toward the second side edge of the flexible display panel) to the rectilinear conductor 4 in FIG. 3, so that the flexible display panel 6 can be unrolled from the reel 1. Alternatively, by adjusting the current direction of the rectilinear conductor 4 and the current direction of the energized coil 7, the magnetic field generated by the energized coil 7 can generate an ampere force to the right (i.e., toward the first side edge of the flexible display panel) to the rectilinear conductor 4 in FIG. 3, so that the flexible display panel 6 can be rolled into the reel 1 and stored. In some exemplary embodiments of the present disclosure, by integrating a conductive coil at one end of the flexible display panel, i.e., using the conductive coil as the magnetic field generating member, the flexible display device can have a relatively simple structure while realizing the movement of the rectilinear conductor on the U-shaped guide rail. Compared with the solution of disposing magnetic poles with the same polarity under the flexible display panel and the guide rail, the structural complexity of the flexible display device can be reduced.

Figure 7:
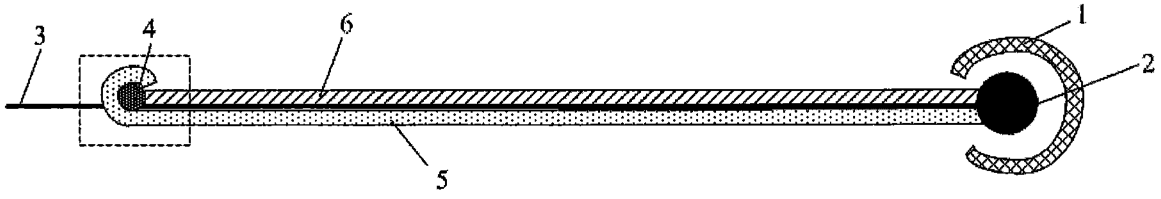
FIG. 7 is a schematic side view of a flexible display device provided with a flexible substrate according to some exemplary embodiments of the present disclosure.
Figure 8:
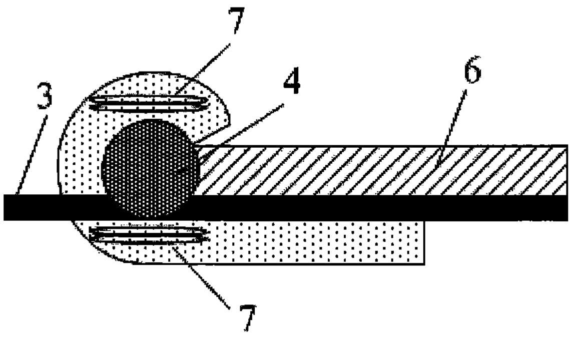
FIG. 8 is an enlarged schematic view of FIG. 7 at the dashed box.

For another example, refer to FIGS. 7 and 8, wherein FIG. 8 is an enlarged structural schematic view of a dashed box in FIG. 7. The flexible display device further includes a flexible substrate 5 disposed under the rectilinear conductor 4. The first side edge of the flexible substrate 5 is fixed to the rotating shaft 2, and the opposite second side edge thereof surrounds the rectilinear conductor 4 upward and is fixed to the rectilinear conductor 4. The flexible substrate 5 is provided with a conductive coil 7 at a position around the rectilinear conductor 4. According to the magnetic effect of the current, a magnetic field will be generated when the conductive coil 7 is energized, and the rectilinear conductor 4 will move on the U-shaped guide rail 3 under the action of the magnetic field provided by the conductive coil 7. Similarly, the conductive coil 7 may be disposed at a position in the flexible substrate 5 around the rectilinear conductor 4, specifically may be disposed above or below the rectilinear conductor 4, or conductive coils may be disposed above and below the conductor.

In addition, in specific implementation, the magnetic field generating member can also take other structural forms, so long as it can provide a stable magnetic field for the flexible display panel, which is within the protection scope of the present disclosure.

In specific implementation, the U-shaped guide rail is a flexible U-shaped guide rail, and when it does not need to display, the U-shaped guide rail is rolled into the reel. In some exemplary embodiments of the present disclosure, the U-shaped guide rail is a flexible U-shaped guide rail, and further, when it does not need to display, the U-shaped guide rail can be rolled into the reel together with the flexible display panel, thereby improving the convenience of the flexible display device in use. The material of the specific flexible U-shaped guide rail can be metal, that is, the flexible U-shaped guide rail can be formed from thin metal wires.

Optionally, the reel is a light shielding reel. In some exemplary embodiments of the present disclosure, the reel is a light shielding reel, which can prevent external light from illuminating the flexible display panel for long time and thus affecting the performance of the flexible display panel when the flexible display panel does not need to display and is rolled into the reel.

Optionally, the flexible display device further comprises a driving member connected with the rotating shaft 2. When the flexible display device does not need to display, the driving member is energized to drive the rotating shaft 2 to move, in order to roll the flexible display panel 6 into the reel 1. Optionally, the driving member may be an electric motor.

In specific implementation, the flexible display device further includes a power supply unit configured to supply power to the magnetic field generating member, the U-shaped guide rail, and the electric motor.

According to the ampere force calculation formula $F=I*L*B*\sin\alpha$, the magnitude of the ampere force subjected by the rectilinear conductor is calculated, wherein: F is the ampere force subjected by the rectilinear conductor; I is the current flowing through the rectilinear conductor; L is the length of the rectilinear conductor bridging across the U-shaped guide rail; B is the magnetic induction intensity of the magnetic field generating member; a is the angle between the current direction in the rectilinear conductor and the magnetic field direction ($\alpha$ is 90 degrees in same exemplary embodiments shown in FIGS. 3-8 of this application). Then, by adjusting at least one of the magnetic induction intensity B of the magnetic field generating member and the magnitude of the current I flowing through the rectilinear conductor, the magnitude of the ampere force F subjected by the rectilinear conductor can be adjusted.

In use, when the flexible display panel needs to be unrolled for display, the magnitude of the ampere force can be controlled by the above-mentioned ampere force control method so as to be larger than the driving force (opposite to the ampere force) applied to the rotating shaft of the reel by the driving member (such as an electric motor), so that the ampere force applied to the rectilinear conductor will drive the flexible display panel to unroll in a direction away from the reel. When the flexible display panel is unrolled to a desired position, at least one of the magnetic induction intensity B and the magnitude of the current I is reduced so that the magnitude of the ampere force F is equal to the magnitude of the driving force applied to the rotating shaft of the reel by the driving member. At this time, the stress subjected by the flexible display panel is in a balanced state and the flexible display panel is in a stationary state. Since the direction of the driving force applied to the rotating shaft of the reel is opposite to the direction of the ampere force, the flexible display panel is in a tensioned state and therefore is in a flat state. When it is necessary to roll the flexible display panel for storage into the reel, at least one of the magnetic induction intensity B and the magnitude of the current I is further reduced so that the magnitude of the ampere force F is smaller than the magnitude of the driving force applied to the rotating shaft of the reel by the driving member, at which time the flexible display panel is rolled into the reel under the action of the driving force to be in the storage state.

The beneficial effects of some exemplary embodiments of the present disclosure are as follows. The flexible display device provided by some exemplary embodiments of the present disclosure includes a magnetic field generating member and a closed circuit composed of a rectilinear conductor and a U-shaped guide rail. A second side edge of the flexible display panel is connected with the rectilinear conductor, and an opposite first side edge thereof is connected with a rotating shaft. Since the energized rectilinear conductor will be subjected to ampere force under the action of the magnetic field, the flexible display panel can be driven by the rectilinear conductor to move. When the flexible display panel needs to display, the flexible display panel can be automatically unrolled from the reel, and when it does not need to display, the flexible display panel can be automatically rolled into the reel by the rotating shaft of the reel, so that the flexible display panel can realize the functions of autonomous unrolling and rolling.

Comparatively, as to the flexible display panel of the related art, when the flexible display panel is unrolled to display, the rolled flexible display panel always tends to be rolled again when unrolled to display, so that the flexible display panel is in a non-flat state when displaying, resulting in the problem of poor display effect when stably displaying. The flexible display device in some implementations of the present disclosure has the following technical effects: when the flexible display panel needs to stably display, due to the provision of the magnetic field generating member, the closed circuit formed by the rectilinear conductor and the U-shaped guide rail, and the rotating shaft, the flexible display panel can stably display when the stress on the flexible display panel is balanced by adjusting the magnetic induction intensity of the magnetic field generating member or the magnitude of the current flowing through the rectilinear conductor and the magnitude of the voltage or current when the rotating shaft is driven to rotate, thereby avoiding the problem that the flexible display panel has poor display effect due to non-flat state when stably displaying.

It should be understood that although various features and beneficial effects of the present disclosure and specific details of the structure and function of the present disclosure have been set forth in the above description, these contents are merely exemplary, and the specific details thereof, especially the shape, size, number and arrangement of components, may be specifically changed within the scope of the principles of the present disclosure to the overall scope represented by the broad general meaning as claimed in the claims of the present disclosure.

Unless otherwise defined, all technical and scientific terms used in this specification have the same meaning as commonly understood by those skilled in the art to which this disclosure belongs.

Those skilled in the art will understand the term "substantially" herein (such as in "substantially all light" or in "substantially consist of"). The term "substantially" may also include embodiments having "wholly", "completely", "all", etc. Therefore, in the embodiments, the adjective is also substantially removable. Where applicable, the term "substantially" may also refer to 90% or more, such as 95% or more, specifically 99% or more, even more specifically 99.5% or more, including 100%. The term "comprising" also includes embodiments in which the term "comprising" means "consisting of". The term "and/or" specifically refers to one or more of the items mentioned before and after "and/or". For example, the phrase "item 1 and/or item 2" and similar phrases may relate to one or more of items 1 and 2. The term "comprising" may refer to "consisting of" in one embodiment, but may also refer to "including at least a defined species and optionally one or more other species" in another embodiment.

Furthermore, the terms first, second, third, etc. in this specification and in the claims are used to distinguish between similar elements and do not denote any order, quantity, or importance. It should be understood that the terms so used are interchangeable under appropriate circumstances and that the embodiments of the present disclosure described herein are capable of operation in a different order than described or illustrated herein.

"Up", "down", "left" and "right" are only used to indicate the relative positional relationship. When the absolute position of the described object changes, the relative positional relationship may also change accordingly.

It should be noted that the above-mentioned embodiments illustrate rather than limit the present disclosure, and that those skilled in the art will be able to design many alternative embodiments without departing from the scope of the appended claims. In the claims, any reference signs placed between parentheses shall not be construed as limiting the claims. The use of the verb "to include" and its conjugations does not exclude the presence of elements or steps other than those stated in a claim. The words "a" or "an" in the claims of the present disclosure do not exclude plural numbers, and are only intended for convenience of description and should not be construed as limiting the scope of protection of the present disclosure.

The present disclosure may be implemented by means of hardware comprising several distinct elements, and by means of a suitably programmed computer. In the device claim enumerating several devices, several of these devices can be embodied by the same item of hardware. The mere fact that certain measures are recited in mutually different dependent claims does not indicate that a combination of these measures cannot be used to advantages.

The present disclosure is further applicable to devices that include one or more of the characterizing features described in this specification and/or shown in the drawings. The present disclosure further relates to methods or processes that include one or more of the characterizing features described in this specification and/or shown in the drawings.

Various aspects discussed in this disclosure may be combined to provide additional advantages. In addition, those skilled in the art will understand that embodiments can be combined, and more than two embodiments can also be combined. In addition, some features may form the basis of one or more divisional applications.

The invention claimed is:

1. A flexible display device comprising:

a flexible display panel;

a reel having a slit opening in a surface thereof and a rotating shaft arranged inside;

a substantially U-shaped guide rail having an open side and a closed end opposite to each other, wherein the closed end is adjacent to the rotating shaft;

a substantially rectilinear conductor configured to bridge the open side of the U-shaped guide rail to form a closed circuit with the U-shaped guide rail; and a magnetic field generating member configured to provide a magnetic field to the rectilinear conductor, wherein a first side edge of the flexible display panel is connected with the rotating shaft of the reel through the slit opening, and a second side edge of the flexible display panel opposite to the first side edge is connected with the rectilinear conductor, wherein the flexible display panel is provided with a conductive coil at a position around the rectilinear conductor, the conductive coil acting as the magnetic field generating member, and wherein the guide rail is U-shaped as a whole and is formed by a continuous thin metal wire as a whole.

2. The flexible display device according to claim 1, wherein the flexible display device is configured such that when the rectilinear conductor is energized, the rectilinear conductor can be forced, thereby causing the flexible display panel to be in one or more of states comprising: unrolling in a direction away from the reel, rolling toward the direction of the reel, or a tensioned and stationary state.

3. The flexible display device according to claim 1, wherein the flexible display panel is configured such that the second side edge borders the rectilinear conductor and is connected to the rectilinear conductor.

4. The flexible display device according to claim 1, wherein the flexible display device is configured such that when the conductive coil is energized, the rectilinear conductor can be forced, thereby causing the flexible display panel to be in one or more of states comprising: unrolling in a direction away from the reel, rolling toward the direction of the reel, or a tensioned and stationary state.

5. The flexible display device according to claim 4, wherein the conductive coil is at a side of a periphery of the rectilinear conductor away from the rectilinear conductor.

6. The flexible display device according to claim 4, wherein the conductive coil is at a side of a periphery of the rectilinear conductor adjacent to the rectilinear conductor.

7. The flexible display device according to claim 1, further comprising:

a flexible substrate under the rectilinear conductor, wherein a first side edge of the flexible substrate is fixed to the rotating shaft, and wherein a second side edge of the flexible substrate opposite to the first side edge borders the rectilinear conductor and is fixed to the rectilinear conductor.

8. The flexible display device according to claim 7, wherein the flexible display device is configured such that when the conductive coil is energized, the rectilinear conductor can be forced, thereby causing the flexible display panel to be in one or more of states comprising: unrolling in a direction away from the reel, rolling toward the direction of the reel, or a tensioned and stationary state.

9. The flexible display device according to claim 1, further comprising:

a driving member connected to the rotating shaft and configured to drive the rotating shaft to move.

10. The flexible display device according to claim 9, wherein the driving member comprises an electric motor.

11. The flexible display device according to claim 10, further comprising:

a power supply unit configured to supply power to at least one of the magnetic field generating member, the U-shaped guide rail or the electric motor.

12. The flexible display device according to claim 1, wherein the U-shaped guide rail comprises a flexible U-shaped guide rail.

13. The flexible display device according to claim 12, wherein a material of the U-shaped guide rail comprises a metal.

14. The flexible display device according to claim 1, wherein the reel comprises a light shielding reel.

15. The flexible display device according to claim 1, wherein a length direction of the slit opening is parallel to an axial direction of the rotating shaft, and wherein an opening direction of the slit opening is aligned with the flexible display panel.

* * * * *